(12) United States Patent
Luo et al.

(10) Patent No.: US 6,915,842 B2
(45) Date of Patent: Jul. 12, 2005

(54) HEAT-TRANSFER DEVICE

(75) Inventors: Chin-Kuang Luo, 5F, No. 56, Min-Chuan Rd., Chung Dist., Taichung City (TW); Chin-Liang Kuo, Ping-Tung (TW)

(73) Assignee: Chin-Kuang Luo, Taichung (TW)

( * ) Notice: Subject to any disclaimer, the term of this patent is extended or adjusted under 35 U.S.C. 154(b) by 11 days.

(21) Appl. No.: 10/622,929

(22) Filed: Jul. 18, 2003

(65) Prior Publication Data

US 2004/0173338 A1 Sep. 9, 2004

(30) Foreign Application Priority Data

Mar. 6, 2003 (TW) ........................................ 92104849 A

(51) Int. Cl.[7] .............................................. F28D 15/00
(52) U.S. Cl. .............................. 165/104.21; 165/104.33
(58) Field of Search ....................... 165/104.21, 104.26, 165/104.33; 361/700

(56) References Cited

U.S. PATENT DOCUMENTS

| | | | | |
|---|---|---|---|---|
| 4,047,198 A | * | 9/1977 | Sekhon et al. ............. 257/713 |
| 5,309,986 A | * | 5/1994 | Itoh ........................ 165/104.26 |
| 5,465,782 A | * | 11/1995 | Sun et al. .............. 165/104.26 |
| 5,582,242 A | * | 12/1996 | Hamburgen et al. ... 165/104.21 |
| 6,227,287 B1 | * | 5/2001 | Tanaka et al. ............. 165/80.4 |
| 6,477,045 B1 | * | 11/2002 | Wang ......................... 361/700 |
| 6,650,544 B1 | * | 11/2003 | Lai ............................. 361/700 |

* cited by examiner

Primary Examiner—Allen J. Flanigan
(74) Attorney, Agent, or Firm—Trop, Pruner & Hu, P.C.

(57) ABSTRACT

A heat-transfer device includes a hollow heat-transfer member made of a thermally conductive material and confining a vacuum sealed chamber therein. The heat-transfer member includes a base portion that is adapted to be placed in thermal communication with a heat source. The base portion has an outer wall surface, an inner wall surface that is opposite to the outer wall surface and that confronts the vacuum sealed chamber, and at least one coolant groove that extends from the inner wall surface toward the outer wall surface and that is in fluid communication with the vacuum sealed chamber. An amount of liquid coolant is contained in the vacuum sealed chamber and is collected in the coolant groove.

1 Claim, 5 Drawing Sheets

HEAT-TRANSFER DEVICE

CROSS-REFERENCE TO RELATED APPLICATION

This application claims priority of Taiwanese Application No. 092104849, filed on Mar. 6, 2003.

BACKGROUND OF THE INVENTION

1. Field of the Invention

The invention relates to a heat-transfer device, more particularly to a heat-transfer device capable of fast heat transfer.

2. Description of the Related Art

Referring to FIG. 1, a conventional heat-transfer device 1 is shown to be disposed on a heat source 2, such as a central processing unit, and includes a hollow heat-transfer member 11 confining a vacuum sealed chamber 111, and a liquid coolant 12 contained in the vacuum sealed chamber 111. The heat-transfer member 11 includes a base portion 112 having a smooth inner wall surface 1121 in contact with the liquid coolant 12. In use, when the temperature of the heat source 2 rises, the liquid coolant 12 on the smooth inner wall surface 1121 gradually absorbs the heat of the heat source 2 transferred thereto through the base portion 112 and is subsequently vaporized. Through heat exchange between the heat-transfer member 11 and the ambient air, the vapors are condensed back into liquid form. As such, the heat of the heat source 2 can be lowered.

However, since the liquid coolant 12 on the smooth inner wall surface 1121 of the base portion 112 is not localized, the transfer of heat from the heat source 2 to the liquid coolant 12 is not efficient.

SUMMARY OF THE INVENTION

Therefore, the main object of the present invention is to provide a heat-transfer device capable of fast heat transfer.

Accordingly, a heat-transfer device of the present invention includes:

a hollow heat-transfer member made of a thermally conductive material and confining a vacuum sealed chamber therein, the heat-transfer member including a base portion that is adapted to be placed in thermal communication with a heat source, the base portion having an outer wall surface, an inner wall surface that is opposite to the outer wall surface and that confronts the vacuum sealed chamber, and at least one coolant groove that extends from the inner wall surface toward the outer wall surface and that is in fluid communication with the vacuum sealed chamber; and an amount of liquid coolant contained in the vacuum sealed chamber and collected in said at least one coolant groove.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
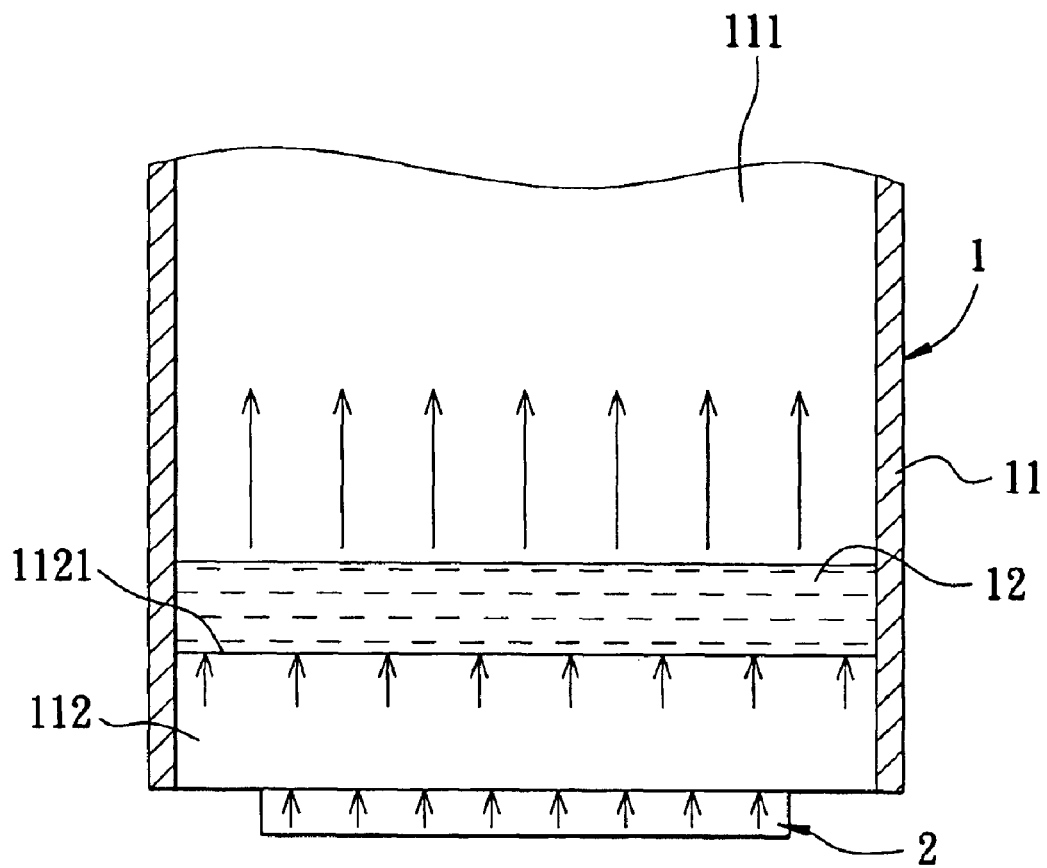
FIG. 1 is a fragmentary, partly sectional view of a conventional heat-transfer device.

Before the present invention is described in greater detail, it should be noted that like elements are denoted by the same reference numerals throughout the disclosure.

Figure 2:
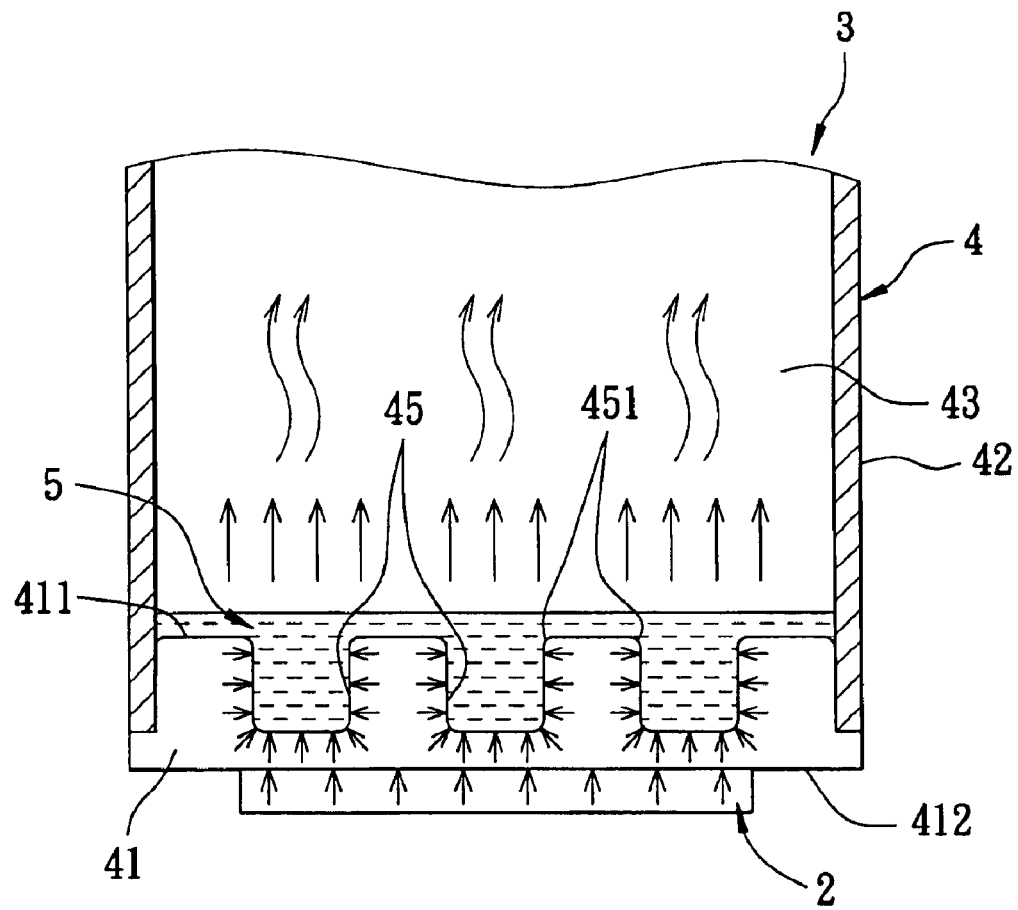
FIG. 2 is a fragmentary, partly sectional view of the first preferred embodiment of a heat-transfer device according to the present invention in a state of use, illustrating evaporation of a liquid coolant within a heat-transfer member.
Figure 3:
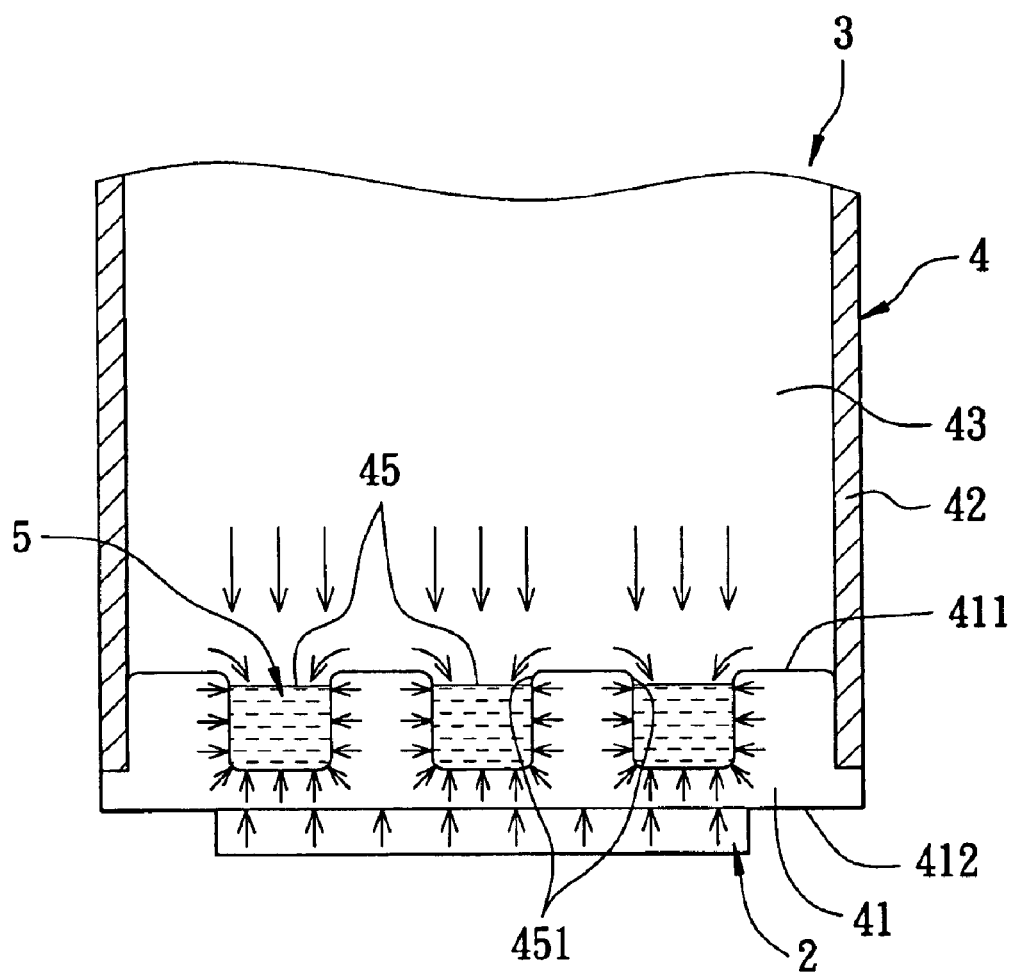
FIG. 3 is a fragmentary, partly sectional view of the first preferred embodiment in a state of use, illustrating condensation of vaporized coolant.

Referring to FIGS. 2 and 3, the first preferred embodiment of a heat-transfer device 3 according to the present invention is shown to include a hollow heat-transfer member 4 made of a thermally conductive material and confining a vacuum sealed chamber 43 therein. The heat-transfer member 4 includes a tubular portion 42 and a base portion 41 that is mounted on the tubular portion 42 to close sealingly one end of the tubular portion 42, and that is adapted to be placed in thermal communication with a heat source 2. In this embodiment, the heat source 2 is a central processing unit. The base portion 41 has an outer wall surface 412, an inner wall surface 411 that is opposite to the outer wall surface 412 and that confronts the vacuum sealed chamber 43, and a plurality of coolant grooves 45 that extend from the inner wall surface 411 toward the outer wall surface 412 and that are in fluid communication with the vacuum sealed chamber 43. In this embodiment, the outer wall surface 412 is a flat surface that is disposed outwardly of the tubular portion 42 and that is adapted to be in thermal contact with the heat source 2. An amount of liquid coolant 5 is contained in the vacuum sealed chamber 43, and is collected in each of the coolant grooves 45. Preferably, each of the coolant grooves 45 has a tapered guiding edge 451 disposed at the inner wall surface 411 of the base portion 41 to guide flow of the liquid coolant 5 thereinto. In addition, the coolant grooves 45 may have any suitable geometrical shape.

In practice, prior to introduction of the liquid coolant 5 into the vacuum sealed chamber 43, the inner wall surface of the tubular portion 42 which confines the vacuum sealed chamber 43 is subjected to passivation, washing and drying to result in a capillary surface that facilitates adhesion of the liquid coolant 5 thereto.

In use, when the working temperature of the heat source 2 rises, the heat emitted from the heat source 2 is quickly conducted to the base portion 41 of the heat-transfer member 4. When the liquid coolant 5 collected in the coolant grooves 45 is excited by the heat, it is quickly vaporized due to the low-pressure within the vacuum sealed chamber 43 of the heat-transfer member 4 (liquids have a relatively low boiling point in a vacuum, low-pressure environment). Besides, as the liquid coolant 5 is localized in the coolant grooves 45, the liquid coolant 5 quickly evaporates into jets of vapor streams that shoot upward toward a top end (not shown) of the tubular portion 42 (see FIG. 2). Then, through heat exchange between the tubular portion 42 and the ambient air, the vaporized liquid coolant 5 soon condenses into liquid form, and drops back into the coolant grooves 45 (see FIG. 3). Thus, the heat from the heat source 2 can be dissipated.

It is noted that the coolant grooves 45 can be arranged in a crisscross pattern for enhancing the heat transfer effect. Moreover, the coolant grooves 45 can be arranged so that the heat-transfer device 3 can be disposed in a tilted or suspended position without affecting adversely the intended heat-transfer effect.

Figure 4:
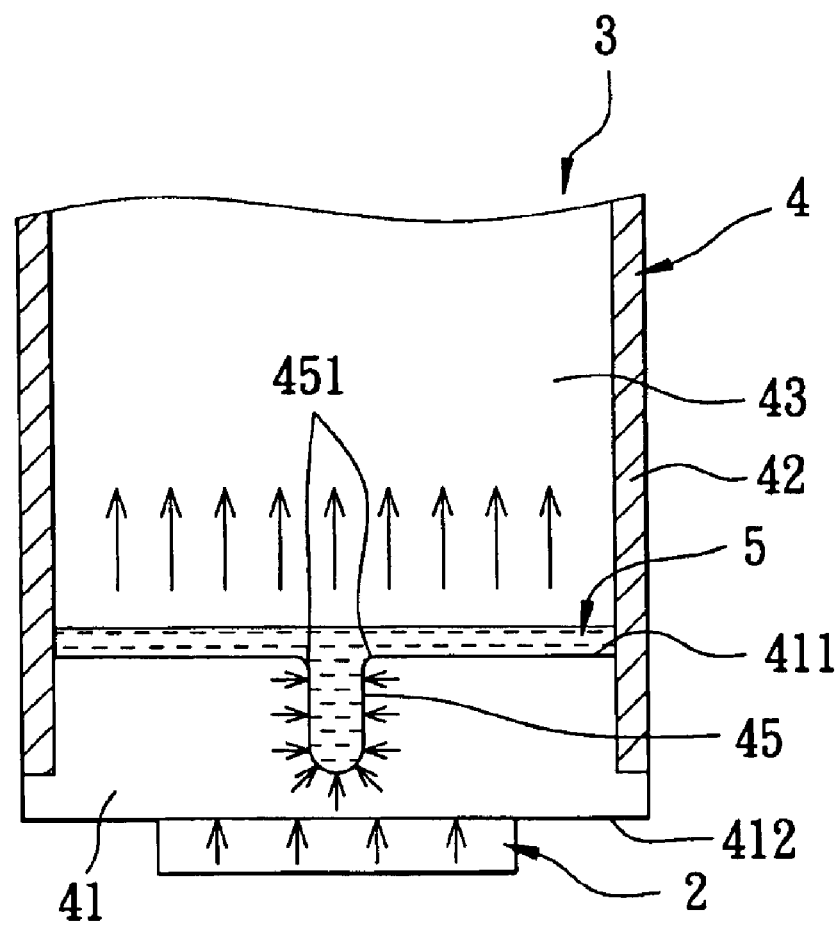
FIG. 4 is a fragmentary, partly sectional view of the second preferred embodiment of a heat-transfer device according to the present invention in a state of use.

FIG. 4 shows the second preferred embodiment of a heat-transfer device 3 according to the present invention, which differs from the previous embodiment mainly in that the base portion 41 has only one coolant groove 45.

Figure 5:
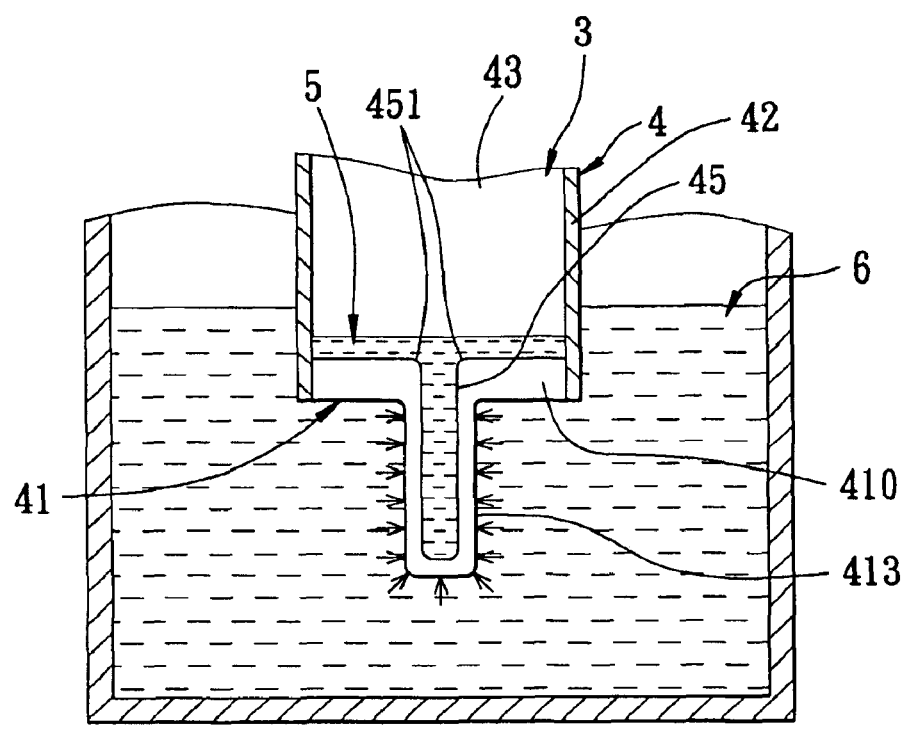
FIG. 5 is a fragmentary, partly sectional view of the third preferred embodiment of a heat-transfer device according to the present invention in a state of use.

FIG. 5 shows the third preferred embodiment of a heat-transfer device 3 according to the present invention, which is similar to the second preferred embodiment. The difference therebetween resides in that the base portion 41 of the heat-transfer member 4 in this embodiment includes an end cap 410 that is mounted on said one end of the tubular portion 42, and a post extension 413 that extends from the end cap 410 and outwardly of the tubular portion 42. The coolant groove 45 is formed through the end cap 410 and extends into the post extension 413. As such, the heat transfer device 3 of this preferred embodiment is adapted to be partly immersed in a hot liquid body 6 for cooling purposes.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A heat-transfer device comprising:

a hollow heat-transfer member made of a thermally conductive material and confining a vacuum sealed chamber therein, said heat-transfer member including a base portion that is adapted to be placed in thermal communication with a heat source, said base portion having an outer wall surface, an inner wall surface that is opposite to said outer wall surface and that confronts said vacuum sealed chamber, and at least one coolant groove that extends from said inner wall surface toward said outer wall surface and that is in fluid communication with said vacuum sealed chamber;

an amount of liquid coolant contained in said vacuum sealed chamber and collected in said at least one coolant groove; and wherein said heat-transfer member further includes a tubular portion, said base portion being mounted on and closing sealingly one end of said tubular portion, wherein said base portion includes an end cap that is mounted on said one end of said tubular portion, and a post extension that extends from said end cap and outwardly of said tubular portion, said at least one coolant groove being formed through said end cap and extending into said post extension.

* * * * *